(12) United States Patent
Camiolo et al.

(10) Patent No.: US 11,398,740 B2
(45) Date of Patent: *Jul. 26, 2022

(54) METHOD FOR SELECTING A SUPPLY SOURCE POWER

(71) Applicant: STMicroelectronics (Grenoble 2) SAS, Grenoble (FR)

(72) Inventors: Jean Camiolo, St. Eg rêve (FR); Christophe Lorin, Montbonnot (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 154 days.

This patent is subject to a terminal disclaimer.

(21) Appl. No.: 16/371,996

(22) Filed: Apr. 1, 2019

(65) Prior Publication Data

US 2019/0312442 A1 Oct. 10, 2019

(30) Foreign Application Priority Data

Apr. 6, 2018 (FR) ...................................... 1853023
Apr. 6, 2018 (FR) ...................................... 1853026
Apr. 6, 2018 (FR) ...................................... 1853027

(51) Int. Cl.
*H02J 7/00* (2006.01)
*G01R 19/25* (2006.01)

(52) U.S. Cl.
CPC .......... *H02J 7/007* (2013.01); *H02J 7/00034* (2020.01); *H02J 7/0045* (2013.01); *G01R 19/25* (2013.01); *H02J 2207/20* (2020.01)

(58) Field of Classification Search
CPC ...... H02J 7/007; H02J 7/0045; H02J 7/00034; H02J 2207/20; G01R 19/25; G06F 1/28; G06F 1/266
USPC ................................ 320/134, 152, 157, 162
See application file for complete search history.

(56) References Cited

U.S. PATENT DOCUMENTS

| 9,914,548 | B1 | 3/2018 | Vadillo | |
|---|---|---|---|---|
| 11,152,807 | B2* | 10/2021 | Camiolo | H02J 7/00712 |
| 2013/0290765 | A1* | 10/2013 | Waters | G06F 1/266 |
| | | | | 713/340 |
| 2017/0085098 | A1* | 3/2017 | Sporck | H02J 7/007 |
| 2017/0201107 | A1 | 7/2017 | Yang et al. | |
| 2017/0256968 | A1* | 9/2017 | Yoon | H01R 24/60 |
| 2017/0336819 | A1 | 11/2017 | Pons | |
| 2018/0067530 | A1* | 3/2018 | Hsieh | G06F 13/4282 |
| 2018/0183340 | A1* | 6/2018 | Waters | H02M 1/36 |
| 2018/0232021 | A1* | 8/2018 | Perchlik | G06F 1/206 |
| 2018/0239410 | A1* | 8/2018 | Paparrizos | H02J 7/342 |
| 2019/0094937 | A1* | 3/2019 | Sultenfuss | G06F 1/1635 |
| 2019/0391628 | A1* | 12/2019 | Camiolo | G06F 1/266 |

FOREIGN PATENT DOCUMENTS

WO 2017/044718 A1 3/2017

* cited by examiner

*Primary Examiner* — Edward Tso
*Assistant Examiner* — Aaron Piggush
(74) *Attorney, Agent, or Firm* — Seed IP Law Group LLP

(57) ABSTRACT

A method selects one or a plurality of sets of values characterizing an electric power of a power source capable of powering a device coupled to the power source via a connection interface. The selection is carried out according to values, characterizing the power supplied by the power source, measured at the connection interface.

20 Claims, 2 Drawing Sheets

METHOD FOR SELECTING A SUPPLY SOURCE POWER

CROSS-REFERENCE TO RELATED APPLICATION(S)

This application claims the priority benefit of French patent application number 18/53027, filed on Apr. 6, 2018, the content of which is hereby incorporated by reference in its entirety to the maximum extent allowable by law.

BACKGROUND

Technical Field

The present disclosure concerns the field of power transmission cables, and more particularly USB-C-type cables and connectors using the USB-PD technology. More particularly, the application relates to means for adapting the voltage and the current of a power source of such a cable.

Description of the Related Art

Although, currently, wireless is one of the main research areas or axes in the field of power and data exchange, cables still seem to be the most reliable way to connect a plurality of electronic devices, be it to exchange data or to power or charge one or a plurality of electronic devices.

Among the different types of cables and connectors of the USB standard, the USB-C type is one of the types which enable to exchange data and power. The USB-PD technology (PD standing for "POWER DELIVERY") is a charging technology which adapts on USB-C-type cables and connectors. This technology enables managing the powering of electronic devices.

It would be desirable to be able to at least partly improve certain aspects of USB-C cables adapted to the USB-PD technology.

BRIEF SUMMARY

An embodiment provides a method of selecting one or a plurality of sets of values characterizing an electric power of a power source capable of powering a device coupled to the power source via a connection interface, wherein the selection is carried out according to values, characterizing the power supplied by the power source, measured at the connection interface.

According to an embodiment, the sets of values include at least one power supply current value, one power supply voltage value, and one minimum power supply voltage value.

According to an embodiment, the measurements of the values characterizing the power supplied by the power source are carried out at least as a result of the connection.

According to an embodiment, the measurements of the values characterizing the power supplied by the power source are carried out periodically.

According to an embodiment, the selection is performed from a list of sets of values provided by a standard.

According to an embodiment, the connection interface includes a circuit capable of adapting the supply power supplied by the power source.

According to an embodiment, the method is adapted to the USB POWER Delivery technology.

According to an embodiment, the device is powered with the power associated with the selected set of values.

Another embodiment provides a method of powering a device from a power source via a connection interface, wherein the supply power of the power source is selected according to the previously-described selection method.

Still another embodiment provides a connection interface, coupling a device to be powered and a power source, including a circuit capable of periodically measuring values characterizing the electric power of a power source to select one or a plurality of sets of values characterizing an electric power of the power source according to the measured values.

According to an embodiment, the connection interface is capable of implementing the above-described selection method.

According to an embodiment, the interface further includes a voltage conversion circuit.

According to an embodiment, the measurement circuit belongs to a control unit.

According to an embodiment, the control unit includes a logic circuit.

According to an embodiment, the control unit includes a temperature measurement circuit and/or a voltage measurement circuit.

The foregoing and other features and advantages will be discussed in detail in the following non-limiting description of specific embodiments in connection with the accompanying drawings.

DETAILED DESCRIPTION

Figure 1:
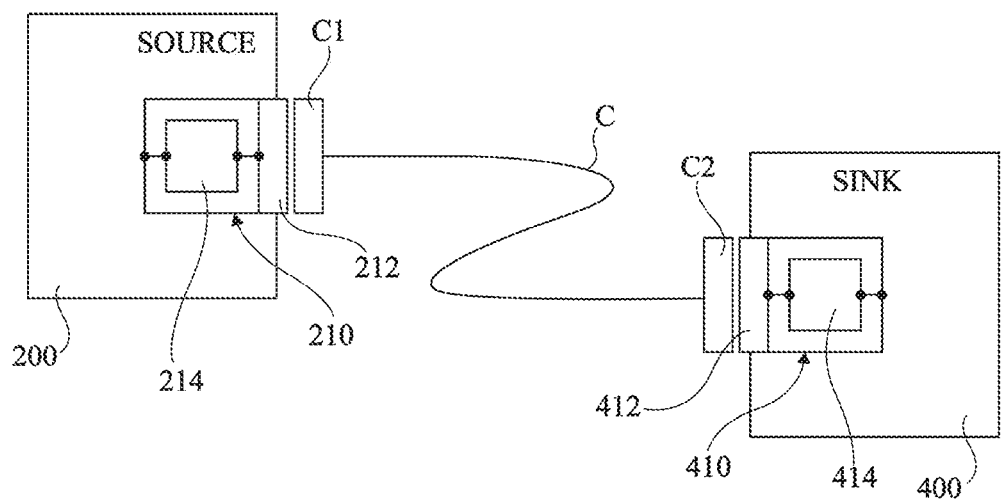
FIG. 1 is a simplified view illustrating a connection between a power source and an electronic device.

The same elements have been designated with the same reference numerals in the different drawings. For clarity, only those steps and elements which are useful to the understanding of the described embodiments have been shown and are detailed. In particular, the management of a negotiation phase relating to the power to be supplied between a device and a power source is not detailed.

Further, only the relevant aspects of the USB-C and USB-PD technologies will be described, the other aspects adapting with no modification.

The terms "approximately", "substantially", "about", and "in the order of" are used herein to designate a tolerance of plus or minus 10%, preferably of plus or minus 5%, of the value in question.

In the present description, the term "connected" will be used to designate a direct electric connection, with no intermediate electronic component, for example, by means of a conductive track, and term "coupled" or term "linked" will be used to designate either a direct electric connection (then meaning "connected") or a connection via one or a plurality of intermediate components (resistor, capacitor, etc.).

One of the research areas or axes to improve connection cables is the development and the improvement of universal cables enabling the exchange of power as well as the exchange of data between all sorts of electronic devices, such as for example cables of USB-C type equipped with the USB-PD technology. The present disclosure aims at the function of power transfer via a cable of this type and more particularly the adaptation of the electric power supplied by a power source according to the needs of the electronic device which is connected thereto, that is, the USB-PD technology. Thus, the function of data exchange via a cable of this type will not be described in the present disclosure.

FIG. 1 is a simplified view illustrating a power transfer between a power source (SOURCE) 200 and an electronic device (SINK) 400 connected via a cable C, for example, of USB-C type equipped with the USB-PD or USB Power Delivery technology. Power source 200 is for example the mains or a DC power supply. Power source 200 may be a computer, a portable battery, etc., or any other electronic device capable of powering a device and/or of charging a battery.

Cable C includes, at each of its ends, a connector C1, C2 adapted to the USB-PD technology. Connectors C1, C2 are generally identical.

Power source 200, and respectively electronic device 400 includes a connection element 210, respectively 410, a connector 212, respectively 412, and a connection interface 214, respectively 414. Each connector 212, 412 is capable of cooperating with the connector C1, C2 of cable C. Each connection interface 214, 414 couples connector 212, 214 to the rest of power source 200 of device 400. Connection interfaces 214, 414 enable adapting the power supplied by power source 200 according to the power required by device 400. During a connection of the power source 200 to the electronic device 400 through the connection interfaces 214, 414, a communication is established between device 400 and power source 200 to decide the electric supply power necessary for device 400 to be supplied and/or charged. More particularly, device 400 indicates the minimum power required for its operation and power source 200 indicates the power that it is capable of supplying. A negotiation, managed by the USB-PD technology, then starts to define what power will be supplied to device 400 by power source 200. Once the negotiation is over, connection interface 214, 414 adapts the voltage and the current of power source 200 according to the result of the negotiation, after which the power supply of device 400 starts.

To indicate what powers power source 200 is capable of supplying, connection interface 214, 414 performs a comparison between a set of values characterizing the power supplied by power source 200 (voltage, current, minimum voltage, etc.) and sets of values characterizing supply powers of a pre-established list recorded in the circuits of connection interfaces 214, 414. This list is programmed in the interfaces circuits and is for example pre-established by a standard.

The set of values characterizing the power supplied by power source 200 is generally programmed in the power source. However, the set of measured values characterizing the power supplied by power source 200 depends on other parameters, for example, on environmental parameters such as temperature, or also on the state (in use or not) of the device used as a power source. Thus, in certain conditions, power source 200 may provide a list of sets of values characterizing supply powers including one or a plurality of values that the source is not really capable of providing.

There thus is a need to ensure the validity of the list of sets of values characterizing a power that a power source 200 is capable of supplying.

Figure 2:
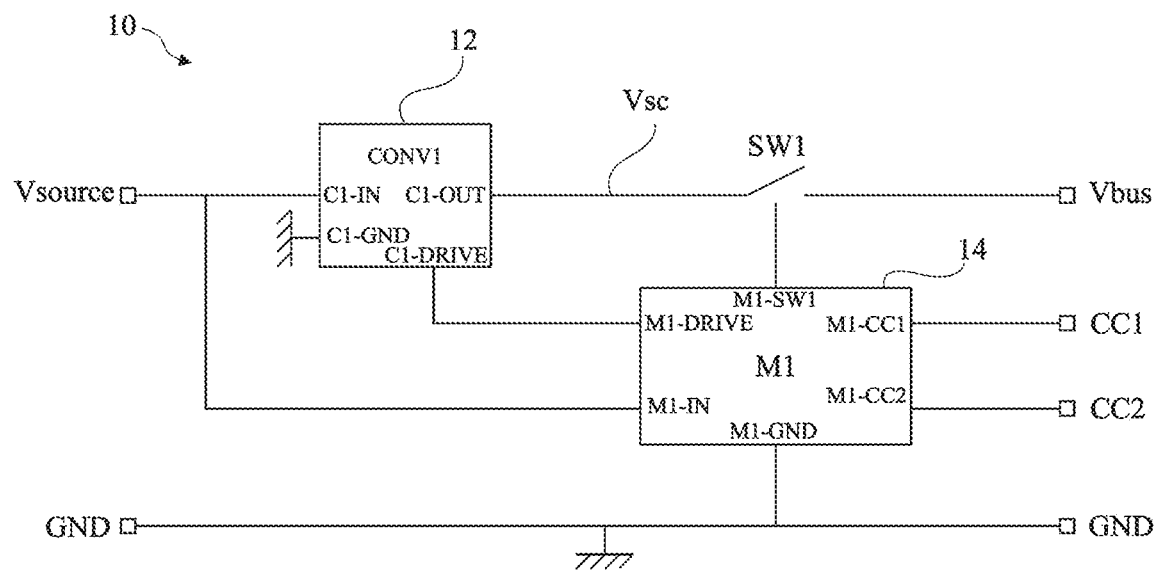
FIG. 2 is a simplified view illustrating an embodiment of an electronic device enabling verifying the state of the power source of FIG. 1.

FIG. 2 is a simplified view illustrating a first embodiment of an electronic device 10 including connection interface 214, 414 of power source 200 and of electronic device 400, respectively. More particularly, a device 10 is positioned in each connection interface 214, 414 of the electronic devices coupled by cable C, but device 10 is only active in the connection interface of the device playing the role of a power source. In the case illustrated in FIG. 1, only the device 10 of connection interface 214 is active.

Device 10 includes at least two input terminals connected to cable C. A first terminal receives an output voltage Vsource of power source 200 referenced with respect to a reference potential GND, for example, the ground, received by a second terminal. Device 10 further includes a first output terminal supplying a power supply voltage Vbus, referenced with respect to the reference potential GND received by a second output terminal, and at least one communication terminal. The output terminals are all coupled to connector C1, C2, which then allows the coupling to power source 200 or device 400. In this embodiment, device 10 includes two communication terminals CC1, CC2. An advantage of having two communications terminals is that, in the case where these terminals are positioned symmetrically on connector C1, C2, this enables manufacturing reversible connectors, that is, connectors, for example of rectangular shape, which can be connected in a first direction and a second direction inverse to the first one.

Device 10 is formed of a converter (CONV1) 12, of a switch SW1, and of a control unit (M1) 14.

Converter 12 is for example a buck converter capable of converting a DC voltage Vsource into a lower DC power supply voltage, for example, when power source 200 is a DC power source, for example, an electronic device capable of powering and/or of charging another electronic device, such as a computer or an external battery. Converter 12 includes:
  an input terminal C1-IN receiving voltage Vsource;
  a terminal C1-GND receiving reference potential GND;
  a control terminal C1-DRIVE; and
  an output terminal C1-OUT supplying a converted voltage Vsc to one of the terminals of switch SW1.

Switch SW1 has one of its terminal connected to output C1-OUT of converter 12, and its other terminal is connected to the output terminal supplying power supply voltage Vbus. Switch SW1 is driven by control unit 14.

Control unit 14 is formed of a voltage measurement circuit and of a logic circuit. Control unit 14 includes:
  an input terminal M1-IN receiving voltage Vsource;
  a terminal M1-GND receiving reference potential GND;
  at least one communication terminal coupled to the communication terminal of device 10 (in the case illustrated in FIG. 2, control unit 14 includes two communication terminals M1-CC1, M1-CC2);
  a terminal M1-DRIVE for controlling converter 12 by transmitting a control signal to terminal C1-DRIVE of converter 12; and
  a terminal M1-SW1 for controlling switch SW1 by transmitting a control signal to switch SW1.

An implementation mode of the method of selecting a supply power and of powering a device 400 using such a device 10 will now be described.

When an electronic device 400 is connected to a power source 200 via a cable C, device 400 sends to power source 200, via communication terminals CC1, CC2, information relative to the necessary power to be supplied thereto.

Control unit 14 measures, via its measurement circuit, output voltage Vsource of power source 200. Switch SW1 is then off.

The logic circuit of control unit 14 then determines the powers that power source 200 is capable of supplying to device 400. For this purpose, the logic circuit includes a memory space including a list of supply powers, each defined by a plurality of values, for example, the power supply current, the power supply voltage, the minimum power supply current, the minimum power supply voltage, etc. This list is pre-established and is defined, for example, by a standard. The logic circuit uses the measured voltage Vsource to determine what power is capable of being be supplied by power source 200, for example, by comparing the measured voltage with each minimum power supply voltage of the powers in the list.

Once the list of powers that the source is capable of supplying has been established, control unit 14 negotiates with device 400 to select a supply power via communication terminals CC1, CC2.

The value of the converted voltage Vsc associated with the selected supply power is then sent to the control terminal of converter 12. Converter 12 then converts voltage Vsource to this new value Vsc. Switch SW1 is then turned on. The converted voltage Vsc then becomes power supply voltage Vbus.

The measurement of voltage Vsource by control unit 14 may be carried out periodically in addition to being carried out for each connection.

Figure 3:
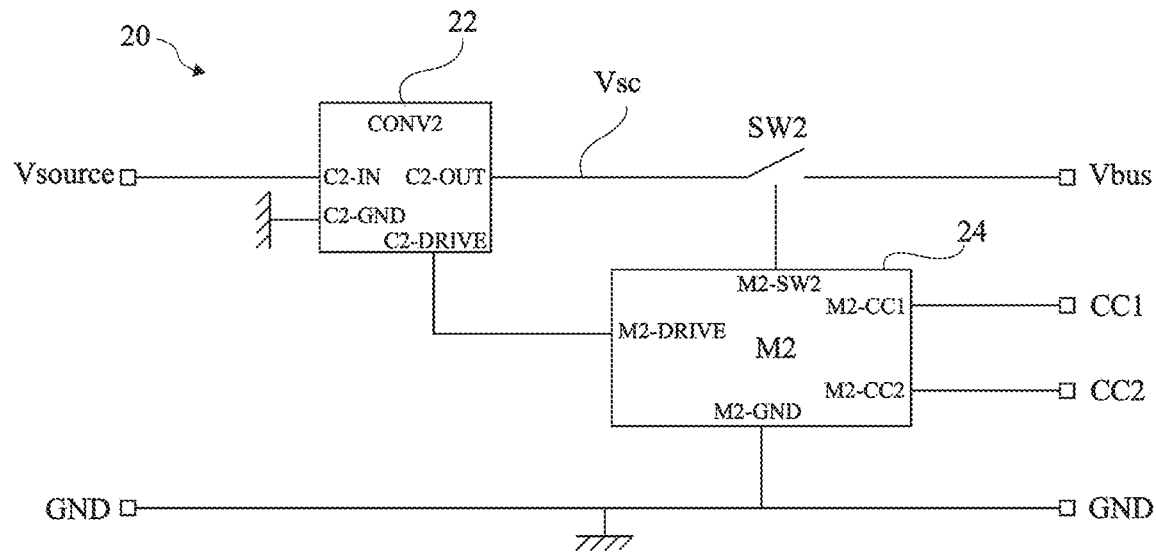
FIG. 3 is a simplified view illustrating another embodiment of an electronic device enabling verifying the state of the power source of FIG. 1.

FIG. 3 is a simplified view illustrating a second embodiment of an electronic device 20 including a connection interface 214, 414 of power source 200 and of device 400.

Device 20 is similar to the device 10 described in relation with FIG. 2 and includes the same input terminals and the same output terminals as device 10. Thus, device 20 includes a converter (CONV2) 22 similar to the converter 12 described in relation with FIG. 2, a switch SW2 identical to the switch SW1 described in relation with FIG. 1, and a control unit (M2) 24 similar to the control unit 14 described in relation with FIG. 2.

Converter 22 includes:
an input terminal C2-IN receiving voltage Vsource;
a terminal C2-GND receiving reference potential GND;
a control terminal C2-DRIVE; and
an output terminal C2-OUT supplying a converted voltage Vsc to one of the terminals of switch SW2.

Switch SW2 has one of its terminal connected to output terminal C2-OUT of converter 22, and its other terminal is connected to the output terminal of device 20 supplying power supply voltage Vbus. Switch SW2 is driven by control unit 24.

Control unit 24 is of the type of control unit 14 but includes s no circuit for measuring output voltage Vsource of power source 200, instead of which unit 24 includes a circuit for measuring the ambient temperature and more particularly the temperature of power source 200 at the level of interface 214, 414, and of connector 212, 412.

Thus, control unit 24 includes:
a terminal M2-GND receiving reference potential GND;
at least one communication terminal coupled to the communication terminal (in the case illustrated in FIG. 3, control unit 24 includes two communication terminals M2-CC1, M2 CC2);
a terminal M2-DRIVE for controlling converter 22 by transmitting a control signal to terminal C2-DRIVE of converter 22; and a terminal M2-SW2 for controlling switch SW2 by transmitting a control signal to switch SW2.

An implementation mode of the method of selecting a supply power and of powering a device 400 using such a device 20 will now be described.

When an electronic device 400 is connected to a power source 200 via a cable C, device 400 sends to power source 200, information relative to the necessary power to be supplied thereto, via communication terminals CC1, CC2. Control unit 24 measures, via its temperature measurement circuit, the temperature of power source 200. Switch SW2 is then off.

The logic circuit of control unit 24 then establishes the powers that power source 200 is capable of supplying to device 400. To achieve this, the logic circuit verifies that the measured temperature of the source is within an interval defined, for example, by the standard. The logic circuit of control unit 24 then selects in the list pre-established by the standard the powers that power source 200 is capable of supplying at the measured temperature.

Control unit 24 negotiates with device 400 to select a supply power via communication terminals CC1, CC2. The value of the converted voltage Vsc associated with the selected supply power is then sent onto control terminal C2-DRIVE of converter 22. Converter 22 then converts voltage Vsource to the new value Vsc. Switch SW2 is then turned on. The converted voltage Vsc then becomes the power supply voltage Vbus.

The measurement of the temperature by control unit 24 may be carried out periodically in addition to being carried out for each connection.

Figure 4:
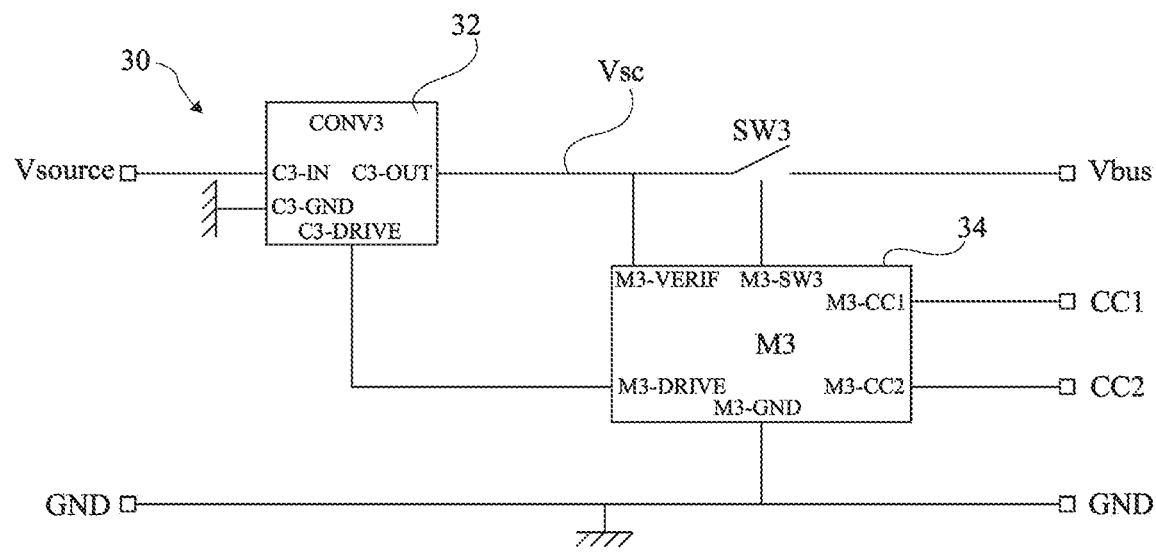
FIG. 4 is a simplified view illustrating still another embodiment of an electronic device enabling verifying the state of the power source of FIG. 1.

FIG. 4 is a simplified view illustrating a third embodiment of an electronic device 30 including connection interfaces 214, 414 of power source 200 and of device 400. In this embodiment, power source 200 is for example an AC voltage and current source such as the mains. In this case, voltage Vsource supplied to device 30 is a DC voltage already rectified by an upstream rectifying circuit, not described herein.

Device 30 is similar to devices 10 and 20 respectively described in relation with FIGS. 2 and 3 and includes the same input terminals and the same output terminals as devices 10 and 20. Thus, device 20 includes a converter (CONV3) 32 similar to converters CONV1 and CONV2 described in relation with FIGS. 1 and 2, a switch SW3 identical to the switches SW1 and SW2 described in relation with FIGS. 1 and 2, and a control unit (M3) 34 similar to the control units M1 and M2 described in relation with FIGS. 1 and 2.

Converter 32 includes:
an input terminal C3-IN receiving voltage Vsource;
a terminal C3-GND receiving reference potential GND;
a control terminal C3-DRIVE; and
an output terminal C3-OUT supplying a converted voltage Vsc to one of the terminals of switch SW3.

Switch SW3 has one of its terminal connected to output C3-OUT of converter 32, and its other terminal is connected to the output terminal of device 30 supplying power supply voltage Vbus. Switch SW3 is driven by control unit 34.

Control unit 34 is formed of a power test circuit and of a logic circuit. Control unit 34 includes:
two communication terminals M3-CC1, M3-CC2, each coupled to communication terminals CC1, CC2;
a terminal M3-SW3 for controlling switch SW3 to supply the converted voltage Vsc to switch SW3;

a control terminal M3-DRIVE transmitting a control signal to converter 32 via an optocoupler, not shown in FIG. 4;

a verification terminal M3-VERIF capable of receiving the converted voltage Vsc; and a terminal M3-GND receiving reference potential GND.

An implementation mode of the method of selecting a supply power and of powering a device 400 using such a device 30 will now be described.

When an electronic device 400 is connected to a power source 200 via a cable C, the device 400 sends to power source 200, via communication terminals CC1, CC2, information relative to the necessary power to be supplied thereto. Switch SW3 is off.

The logic circuit of control unit 34 then determines the powers that power source 200 is capable of supplying to device 400. For this purpose, the test circuit of control unit 34 tests each power defined in the list pre-established by the standard to determine whether the power source is capable of supplying it. The powers that power source 200 is not capable of supplying are deselected from the list and the others are selected to be suggested to device 400 during the negotiation. To perform the test, control unit 34 measures the value of voltage Vsc via its terminal M3-VERIF and deduces therefrom the control signal to be sent to converter CONV3.

The negotiation between device 400 and power source 200 is then performed to decide upon a power value to be supplied. Once a supply power has been selected, the control unit 34 transmits this information to converter 32 via the optocoupler. The optocoupler enables to measure the value of voltage Vsource.

Voltage Vsource is then converted into voltage Vsc by converter 32 to correspond to the expected value. Switch SW3 is then turned on to transmit the voltage Vsc, which is then equal to the selected voltage Vbus.

Specific embodiments have been described. Various alterations, modifications, and improvements will occur to those skilled in the art. In particular, it is possible to combine the embodiments of FIGS. 2, 3, and 4, that is, to add a voltage measurement circuit, a temperature measurement circuit, and/or a power test circuit to devices 10, 20, and 30.

Various embodiments with different variations have been described hereinabove. It should be noted that those skilled in the art may combine various elements of these various embodiments and variations thereof.

Such alterations, modifications, and improvements are intended to be part of this disclosure, and are intended to be within the spirit and the scope of the present disclosure. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
    selecting at least one set of values characterizing an electric power of a power source capable of powering an electronic device coupled to the power source through a first connection interface that is located within the power source, the electronic device having a second connection interface located within the electronic device, each of the first and second interfaces including respective circuitry configured to measure values characterizing a power supplied by the power source and the electronic device, respectively, wherein, in use, the circuitry is active in only one of the first or the second interface, depending on which of the power source or the electronic device is being utilized as a power supply source,
    wherein the selecting includes measuring at the first connection interface, by the circuitry included within the first connection interface, values characterizing the power supplied by the power source.

2. The method of claim 1, wherein selecting the at least one set of values comprises selecting at least one power supply current value, one power supply voltage value, and one minimum power supply voltage value.

3. The method of claim 1, wherein measuring at the first connection interface the values characterizing the power supplied by the power source comprises measuring the values in response to a connection of the power source to the electronic device through the first connection interface.

4. The method of claim 1, wherein the measuring at the first connection interface values characterizing the power supplied by the power source comprises periodically measuring the values characterizing the power supplied by the power source.

5. The method of claim 1, wherein the selecting at least one set of values comprises selecting the at least one set of values from a list of sets of values defined by a standard.

6. The method of claim 1, wherein the method further comprises adapting, through the first connection interface, the power supplied by the power source.

7. The method of claim 1, further comprising transferring power from the power source to the electronic device through the first connection interface according to one of the USB POWER DELIVERY standards.

8. The method of claim 7, wherein transferring power comprises transferring power based on the selected at least one set of values.

9. A device, comprising:
    a first connection interface configured to couple an electronic device to be powered and a power source, the first connection interface being located within the power source and including circuitry located within the first connection interface configured to periodically measure values characterizing an electric power of the power source and to select a set of values characterizing the electric power of the power source based on the measured values; and
    a second connection interface located within the electronic device and including circuitry located within the second connection interface configured to periodically measure values characterizing an electric power of the electronic device and to select a set of values characterizing the electric power of the electronic device based on the measured values,
    wherein, in use, the circuitry of only one of the first or the second interface is active, depending on which of the power source or the electronic device is being utilized as a power supply source.

10. The device of claim 9, wherein the circuitry located within the first connection interface includes:
    a voltage converter configured to generate a converted voltage to be supplied to the electronic device in response to a control signal; and a control unit coupled to the voltage converter and configured to measure the values characterizing the electric power of the power source and to select the set of values, and is further configured to generate the control signal based on the selected set of values.

11. The device of claim 10, wherein the control unit is further configured to measure the converted voltage.

12. The device of claim 10, wherein the voltage converter receives a source voltage and wherein the control unit is further configured to measure the source voltage.

13. The device of claim 10, wherein the voltage converter comprises a switching converter.

14. The device of claim 10, wherein the control unit comprises a logic circuit configured to determine a power capable of being supplied by the power source based on the measured source voltage.

15. The device of claim 10, wherein the control unit is further configured to measure a temperature of the power source.

16. A power source device, comprising:
a first connection interface located within the power source device and configured to be coupled to an electronic device having a second connection interface, the first connection interface including communication terminals and further including first circuitry, the first circuitry including:
a voltage converter located within the first connection interface and configured to receive a source voltage and configured to generate from the source voltage a converted voltage based on a control signal; and
a control unit located within the first connection interface and coupled to the voltage converter and to the communication terminals, the control unit configured to receive from the electronic device over the communication terminals information indicating an electric power to be supplied to the electronic device, and the control unit further configured to measure a value characterizing an electric power the voltage converter is capable of providing to the electronic device and to communicate over the communication terminals with the electronic device to negotiate with the electronic device a power to be supplied to the electronic device,
wherein the second connection interface includes second circuitry configured to measure values characterizing a power supplied by the electronic device, wherein, in use, only one of the first circuitry or the second circuitry is active, depending on which of the power source device or the electronic device is being utilized as a power supply source.

17. The power source device of claim 16, wherein the voltage converter comprises a switching converter.

18. The power source device of claim 16, wherein the control unit is configured to measure one of the source voltage supplied to the voltage converter and the converted voltage generated by the voltage converter.

19. The power source device of claim 16, wherein the first connection interface is further configured to receive a cable to couple the first connection interface to the second connection interface of the electronic device.

20. The power source device of claim 19, wherein the cable comprises a USB-C-type cable.

* * * * *

UNITED STATES PATENT AND TRADEMARK OFFICE
CERTIFICATE OF CORRECTION

PATENT NO. : 11,398,740 B2
APPLICATION NO. : 16/371996
DATED : July 26, 2022
INVENTOR(S) : Jean Camiolo et al.

It is certified that error appears in the above-identified patent and that said Letters Patent is hereby corrected as shown below:

On the Title Page

"(72) Inventors: Jean Camiolo, St. Eg rêve (FR)"
Should read:
--(72) Inventors: Jean Camiolo, St. Egrêve (FR)--.

Signed and Sealed this
Fourth Day of October, 2022

Katherine Kelly Vidal
*Director of the United States Patent and Trademark Office*